(12) United States Patent
Ryu et al.

(10) Patent No.: US 8,546,199 B2
(45) Date of Patent: Oct. 1, 2013

(54) METHOD OF MANUFACTURING TRANSPARENT TRANSISTOR WITH MULTI-LAYERED STRUCTURES

(71) Applicant: Electronics and Telecommunications Research Institute, Daejeon (KR)

(72) Inventors: Min Ki Ryu, Seoul (KR); Chi Sun Hwang, Daejeon (KR); Chun Won Byun, Daejeon (KR); Hye Yong Chu, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/792,436

(22) Filed: Mar. 11, 2013

(65) Prior Publication Data

US 2013/0189816 A1    Jul. 25, 2013

Related U.S. Application Data

(62) Division of application No. 13/590,768, filed on Aug. 21, 2012, now Pat. No. 8,409,935, which is a division of application No. 12/554,066, filed on Sep. 4, 2009, now Pat. No. 8,269,220.

(30) Foreign Application Priority Data

Dec. 22, 2008    (KR) .................. 10-2008-0131647

(51) Int. Cl.
*H01L 21/336*    (2006.01)

(52) U.S. Cl.
USPC ........... 438/149; 438/151; 438/156; 438/161; 438/164; 257/E21.41

(58) Field of Classification Search
USPC .... 438/149, 151, 156, 161, 164; 257/E21.41
See application file for complete search history.

(56) References Cited

U.S. PATENT DOCUMENTS

| | | | |
|---|---|---|---|
| 7,719,626 | B2 | 5/2010 | Takahashi et al. |
| 8,148,721 | B2 | 4/2012 | Hayashi et al. |
| 2003/0122498 | A1 | 7/2003 | Park |
| 2005/0170643 | A1 | 8/2005 | Fujii et al. |
| 2006/0269786 | A1 | 11/2006 | Shin et al. |
| 2009/0072260 | A1 | 3/2009 | Jeong et al. |
| 2011/0050733 | A1 | 3/2011 | Yano et al. |

FOREIGN PATENT DOCUMENTS

| | | |
|---|---|---|
| JP | H10-062816 A | 3/1998 |
| JP | 11-070610 A | 3/1999 |
| JP | 2006-332674 A | 12/2006 |
| JP | 2008-166716 A | 7/2008 |
| KR | 10-2007-0008257 A | 1/2007 |
| KR | 10-2007-0063067 A | 6/2007 |

*Primary Examiner* — Thanh V Pham
(74) *Attorney, Agent, or Firm* — Rabin & Berdo, P.C.

(57) ABSTRACT

A method of manufacturing a transparent transistor including a substrate, source and drain electrodes formed on the substrate, each having a multi-layered structure of a lower transparent layer, a metal layer and an upper transparent layer, a channel formed between the source and drain electrodes, and a gate electrode aligned with the channel. The lower transparent layer or the upper transparent layer is formed of a transparent semiconductor layer, which is the same as the channel.

3 Claims, 11 Drawing Sheets

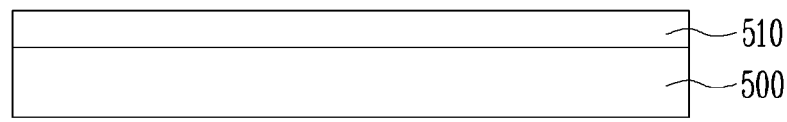
FIG. 5A
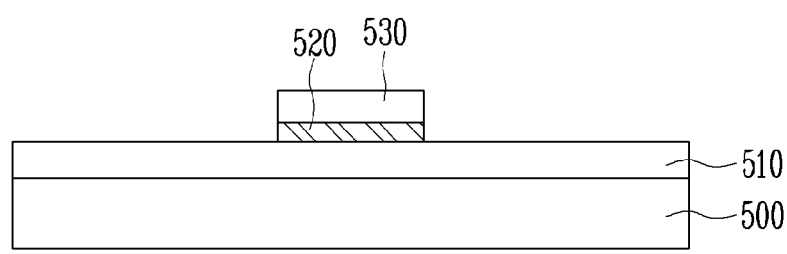
FIG. 5B
FIG. 5C
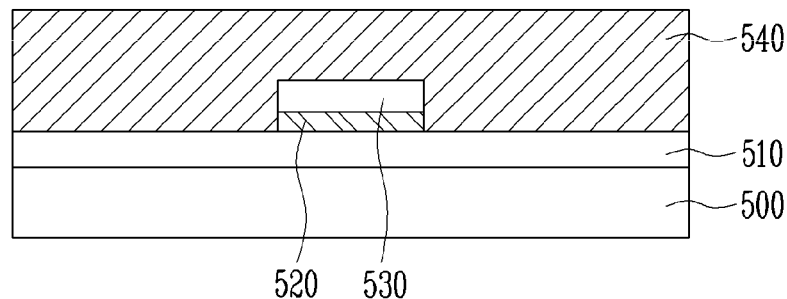
FIG. 5D
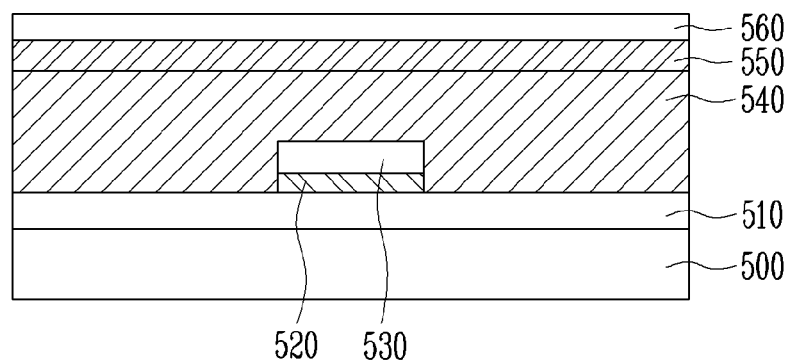

METHOD OF MANUFACTURING TRANSPARENT TRANSISTOR WITH MULTI-LAYERED STRUCTURES

CROSS-REFERENCE TO RELATED APPLICATIONS

This application is a divisional of co-pending application Ser. No. 13/590,768 filed on Aug. 21, 2012, which is a divisional of application Ser. No. 12/554,066 filed on Sep. 4, 2009 (now U.S. Pat. No. 8,269,220, issued on Sep. 18, 2012), and claims priority to and the benefit of Korean Patent Application No. 10-2008-0131647, filed Dec. 22, 2008, the disclosure of which is incorporated herein by reference in its entirety.

BACKGROUND

1. Field of the Invention

The present invention relates to a transparent transistor, and particularly, to a structure of a transparent transistor having high transmittance.

2. Discussion of Related Art

To manufacture a transparent transistor, all materials constituting the transistor, for example, a semiconductor, an insulator and a metal, should be transparent. Insulators are generally transparent in a visible light range, and in the case of semiconductor, oxide semiconductors, which have been recently used for transistors, are transparent. In the case of metal, since ITOs have the lowest resistance of transparent metals, ITOs are generally used for transistors.

However, as displays become larger, an interconnection length increases and electric conductivity of ITO is insufficient to be applied to a high-performance transparent circuit. Accordingly, a metal is used as an auxiliary interconnection to decrease an electrical resistance of the interconnection. However, in this case, an additional process is required and overall transmittance decreases because of the opaque metal interconnection.

Meanwhile, when a multi-layered transparent conductive layer is applied to a thin film transistor using a common manufacturing process, problems can be caused by etching of a multi-layered thin film, a contact resistance between source and drain electrodes and a semiconductor, and additional processes for deposition of the multi-layered thin film.

SUMMARY OF THE INVENTION

The present invention is directed to an optimized transparent transistor having a stacked structure capable of improving transparency and conductivity.

One aspect of the present invention provides a transparent transistor including: a substrate; source and drain electrodes disposed on the substrate, each having a multi-layered structure of a lower transparent layer, a metal layer and an upper transparent layer; a channel formed between the source and drain electrodes; and a gate electrode aligned with the channel. Here, the lower transparent layer and the upper transparent layer are formed of the same transparent semiconductor layer as the channel.

The gate electrode may be formed in a multi-layered structure of the lower transparent layer, the metal layer and the upper transparent layer.

The upper or lower transparent layer of each of the source, drain or gate electrodes may be formed of a nitride layer.

The lower transparent layer of the gate electrode may be formed of an insulating layer electrically insulating the gate electrode from the substrate.

Another one of the upper and lower transparent layers of each of the source and drain electrodes may be formed of a transparent conductive or insulating layer.

The nitride layer forming the lower or upper transparent layer may have a refractive index of 2.0 or higher.

Another aspect of the present invention provides a method of manufacturing a transistor, including: sequentially stacking a transparent semiconductor layer, a metal layer and a transparent layer on a substrate and patterning these layers to define source and drain regions and a channel region; etching the transparent layer and the metal layer in the channel region to expose the transparent semiconductor layer; and forming an insulating layer to cover the exposed transparent semiconductor layer.

Still another aspect of the present invention provides a method of manufacturing a transistor, including: stacking a transparent layer and a metal layer on a substrate and etching the metal layer in a channel region to expose the lower transparent layer; stacking a transparent semiconductor layer to cover the exposed transparent layer and the metal layer, and etching the transparent semiconductor layer to form source and drain electrodes and a channel; and forming an insulating layer to cover the source and drain electrodes and the channel.

The method may further include forming a gate electrode on the insulating layer.

The forming of the gate electrode may include: forming a lower transparent layer on the insulating layer; forming a metal layer on the lower transparent layer; forming an upper transparent layer on the metal layer; and aligning the lower transparent layer, the metal layer and the upper transparent layer with the channel, and etching the layers to form the gate electrode.

One of the transparent layer and the transparent semiconductor layer of the source and drain electrodes, and one of the lower and upper transparent layers of the gate electrode may include a nitride layer.

Yet another aspect of the present invention provides a method of manufacturing a transistor, including: stacking a transparent semiconductor layer, a metal layer and a transparent layer on a substrate to form source and drain electrodes; forming a first gate insulating layer on the source and drain electrodes; applying a photoresist onto the first gate insulating layer, and etching the transparent layer and the metal layer using a mask to form a channel; forming a second gate insulating layer on the photoresist and the channel; forming a gate electrode on the second gate insulating layer; and removing the photoresist.

The transparent semiconductor or the transparent layer may be formed of a nitride layer.

The first gate insulating layer may be formed thicker than the second gate insulating layer.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which:

FIGS. 5A to 5H are cross-sectional views showing a process of manufacturing a transparent transistor according to a fourth exemplary embodiment of the present invention.

DETAILED DESCRIPTION OF EXEMPLARY EMBODIMENTS

Hereinafter, the present invention will be described with reference to the accompanying drawings in detail. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Throughout the specification, when one part is stated to "include" a component, unless illustrated otherwise, this does not mean that another component is omitted, but another component may be further included.

A transparent thin film transistor according to the present invention will now be described with reference to FIG. 1.

Figure 1:
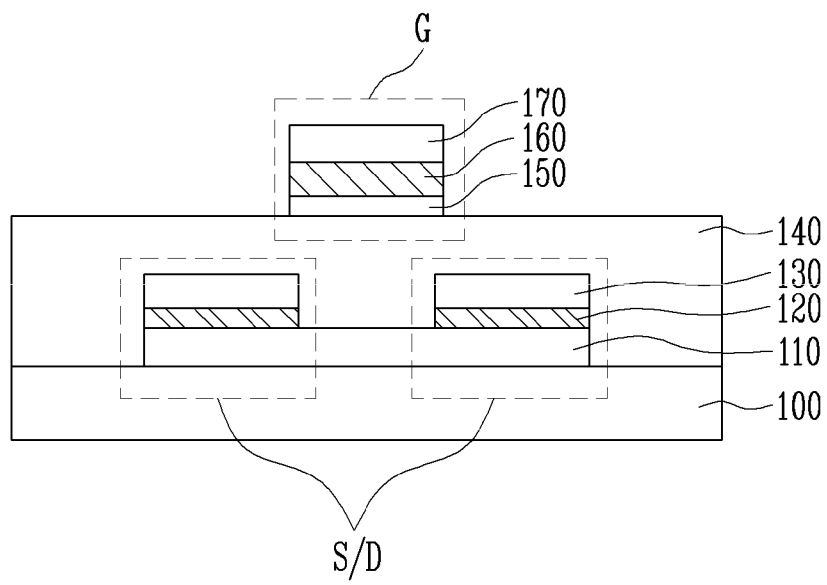
FIG. 1 is a cross-sectional view of a transparent transistor according to a first exemplary embodiment of the present invention.

FIG. 1 is a cross-sectional view of a transistor according to a first exemplary embodiment of the present invention.

Referring to FIG. 1, the transistor according to a first exemplary embodiment of the present invention is a coplanar-type thin film transistor, in which a semiconductor layer 110 is formed on an insulating substrate 100, and source and drain electrodes S and D facing each other are formed on the semiconductor layer 110.

An insulating layer 140 is formed to cover the source and drain electrodes S and D and the semiconductor layer 110, and a gate electrode G is formed over the insulating layer 140 to be aligned with the semiconductor layer 110 between the source and drain electrodes S and D.

Each of the source and drain electrodes S and D has a stacked structure in which the semiconductor layer 110, a metal layer 120 and a transparent conductive/insulating layer 130 are sequentially stacked.

That is, parts of the semiconductor layer 110 become parts of the source and drain electrodes S and D, and a middle part of the semiconductor layer 110 becomes an active region forming a channel of the transistor.

The gate electrode G also has a stacked structure of a transparent layer 150, a metal layer 160 and a transparent layer 170 like the source and drain electrode S and D, and the transparent layers 150 and 160 disposed above and below the metal layer 160 may be transparent insulating or conductive layers.

That is, the gate electrode G and the source and drain electrodes S and D are formed of a multi-layered thin film transparent conductive layer into which the thin metal layers 160 and 120 having lower electric resistances than ITO widely used in the conventional art are interposed.

Likewise, the multi-layered thin film transparent conductive layer into which the thin metal layers 160 and 120 are interposed may be more transparent in a visible light range than a single metal layer. A material having a refractive index of about 2 or more is in contact with a material having a relatively low refractive index, and when light is transmitted, a large electric field is generated at an interface between the materials. Here, when a thickness of the transparent conductive layer is controlled to reduce a wavelength of light in a visible light range by half, an intensity of an electric field of light in the middle of the thickness has the minimum value. When the metal is disposed at a position having the minimum electric field of light, interaction between the transmitted light and an electron of the metal is very weak, and thus an overall transmittance of the multi-layered thin film transparent conductive layer into which a metal thin film is interposed is increased.

Here, the metal requires high electric conductivity, sufficiently low resistance with a small thickness, and low optical absorbance, which thus may be Ag. Alternatively, various Ag alloys including, for example, Cu or Pd, may be used.

A transparent thin film in contact with the metal layers 160 and 120 may have high transmittance in a visible light range, and a refractive index of at least 1.9. When the refractive index of an oxide is about 1.9 to 2.0, the overall thickness of the conductive layer may range from 60 to 130 nm, and preferably about 100 nm. When the metal layers 160 and 120 are formed of Ag, the thickness may range from 1 to 15 nm, and preferably 10 to 12 nm.

Materials having high refractive indexes around the metal layers 160 and 120 may have various electrical properties.

One layer of each of the source and drain electrodes S and D is formed of a transparent semiconductor used as the semiconductor layer 110 of the transistor, which may be ZnO (refractive index=1.93), $SnO_2$ (refractive index=2.0), ZnSnOx, InGaZnOx, GaN (refractive index=2.5), AN (refractive index=2.05), InN, or a combination thereof such as AlGaN, GaInN, AlInN, AlGaInN or ZnS (refractive index=2.4). That is, when a structure of a transparent conductor/metal/semiconductor, or a structure of an insulator/metal/semiconductor is formed using the semiconductor, the structure itself can be used as a transparent electrode.

At least one of the transparent layers disposed above and below each of the metal layers 160 and 120 respectively constituting the gate electrode G and the source and drain electrodes S and D may be formed of a nitride layer having a high refractive index to improve transparency and conductivity.

A method of manufacturing the transistor of FIG. 1 will now be described with reference to FIGS. 2A to 2E.

Figure 2A:
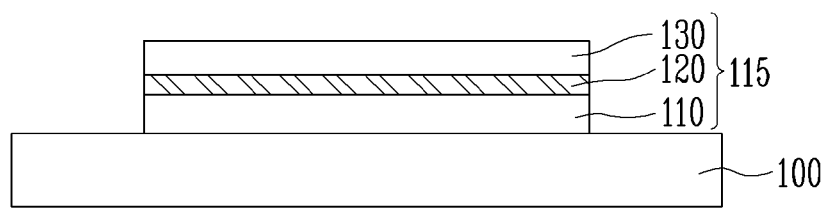
FIGS. 2A to 2E are cross-sectional views showing a process of manufacturing the transparent transistor shown in FIG. 1.

First, as shown in FIG. 2A, a multi-layered transparent conductive layer 115 is formed on an insulating substrate 100.

The transparent conductive layer 115 includes a transparent semiconductor layer 110 at the bottom, and a metal layer 120 and a transparent conductive/insulating layer 130 stacked thereon, and is etched to leave source and drain electrodes and a channel region therebetween.

In this three-layered transparent conductive layer 115, the transparent conductive layer 110 or the uppermost transparent conductive/insulating layer 130 is formed of a nitride layer, and the metal layer 120 is formed of Ag, which has good conductivity, thereby ensuring transparency and conductivity.

Figure 2B:
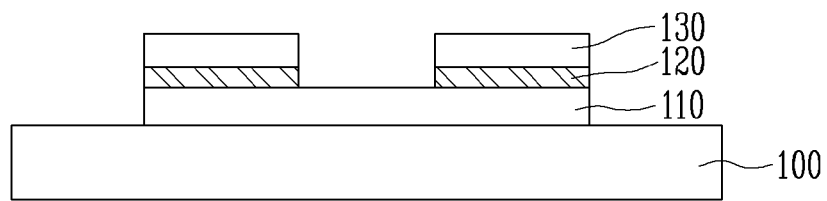

As shown in FIG. 2B, the metal layer 120 and the transparent conductive/insulating layer 130 in the channel region are etched to expose the lowermost transparent semiconductor layer 110 in the channel region, thereby defining the source and drain electrodes and the channel.

Figure 2C:
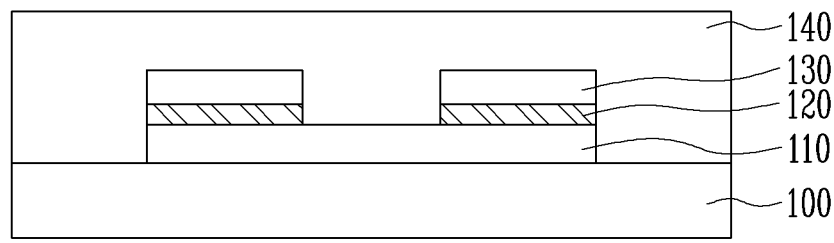
Figure 2D:
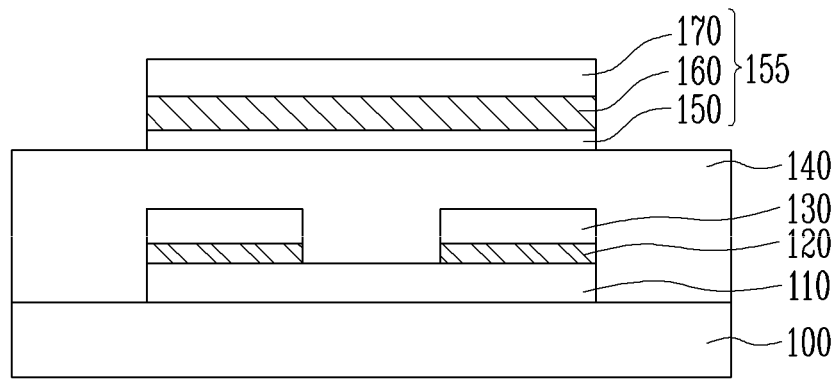

As shown in FIG. 2C, an insulating layer 140 is formed on the source and drain electrodes and the channel, and as shown in FIG. 2D, a transparent conductive layer 155 having a multi-layered structure of a transparent conductive/insulating layer 150, a metal layer 160 and a transparent conductive/insulating layer 170 is formed on the insulating layer 140.

Figure 2E:
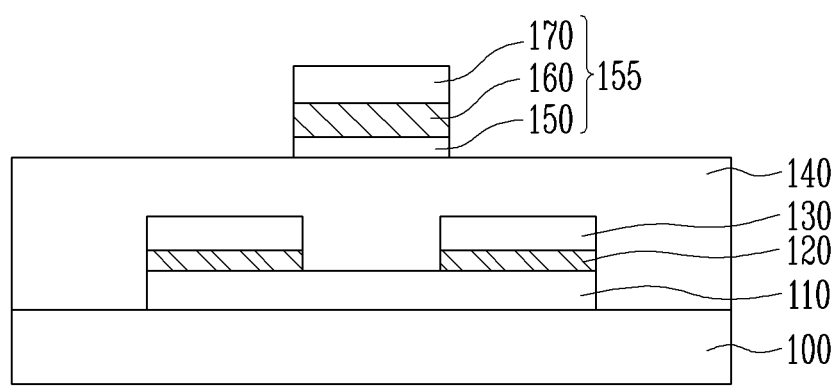

Finally, the transparent conductive layer 155 is etched to be aligned with the channel using a mask used when the channel is etched, thereby forming a gate electrode shown in FIG. 2E.

As described above, when the lower transparent layer of the source and drain electrodes S and D is formed of the same semiconductor as the channel, an overlap margin is not needed, and a contact resistance can be reduced between the source and drain electrodes S and D and the semiconductor of the channel. In addition, when the channel and the gate electrode are formed using the same mask, a pattern is formed with two masks and thus alignment is simplified.

A transistor according to a second exemplary embodiment of the present invention will now be described with reference to FIGS. 3A to 3F.

The transistor according to a second exemplary embodiment of the present invention is an inverted staggered-type thin film transistor, in which source and drain electrodes and a gate electrode are formed of a multi-layered transparent conductive layer.

Figure 3A:
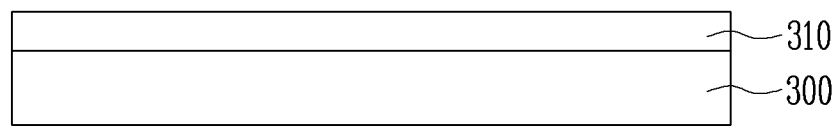
FIGS. 3A to 3F are cross-sectional views showing a process of manufacturing a transparent transistor according to a second exemplary embodiment of the present invention.
Figure 3B:
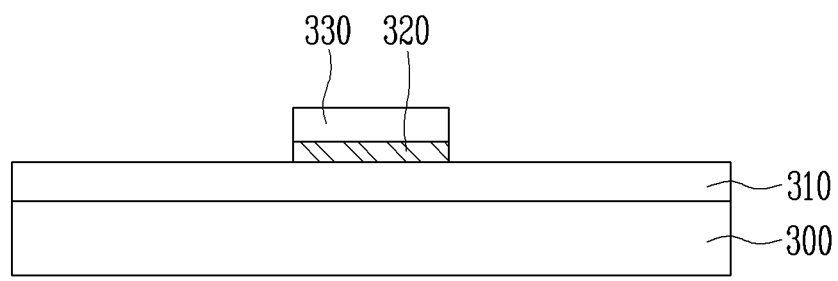

To be specific, as shown in FIG. 3A, a transparent insulating layer 310 is formed on a substrate 300, and as shown in FIG. 3B, a metal layer 320 and a transparent insulating/conductive layer 330 are formed, followed by patterning the metal layer 320 and the transparent insulating/conductive layer 330 to be a gate electrode shape, and thus a gate electrode is completed.

The gate electrode is formed of a transparent conductive layer having a multi-layered structure of a transparent insulating layer 310 at the bottom, a metal layer 320 and a transparent insulating/conductive layer 330. Here, an insulating layer electrically insulating the substrate 300 from the gate electrode is used as one of the insulating layers in the multi-layered structure of the gate electrode, thereby ensuring transparency without an additional process.

Figure 3C:
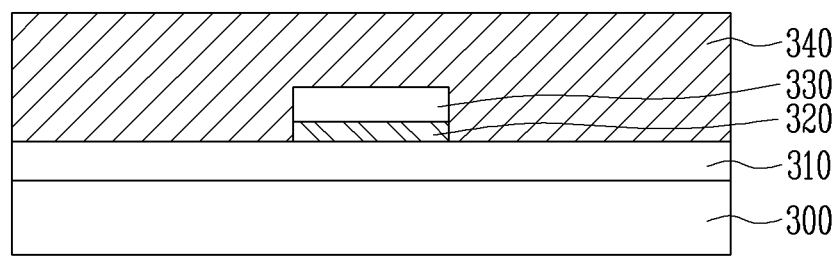

Subsequently, as shown in FIG. 3C, a gate insulating layer 340 is formed on the gate electrode, which is formed of $SiO_2$ or $Al_2O_3$ having a low refractive index.

Figure 3D:
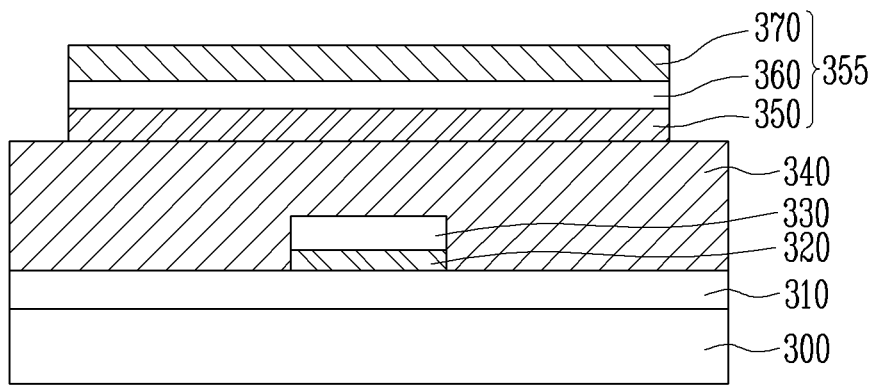

As shown in FIG. 3D, a multi-layered transparent conductive layer 355 is deposited, and then patterned in the shape of source and drain electrodes and a channel.

Figure 3E:
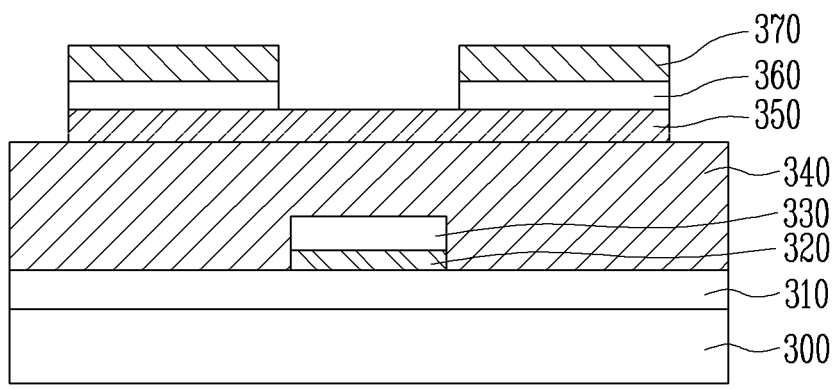

The multi-layered transparent conductive layer 355 includes a transparent semiconductor layer 350 at the bottom, a metal layer 360 and a transparent conductive/insulating layer 370, and as shown in FIG. 3E, the metal layer 360 and the transparent conductive/insulating layer 370 in the channel region are etched to expose the transparent semiconductor layer 350 in the channel region.

Figure 3F:
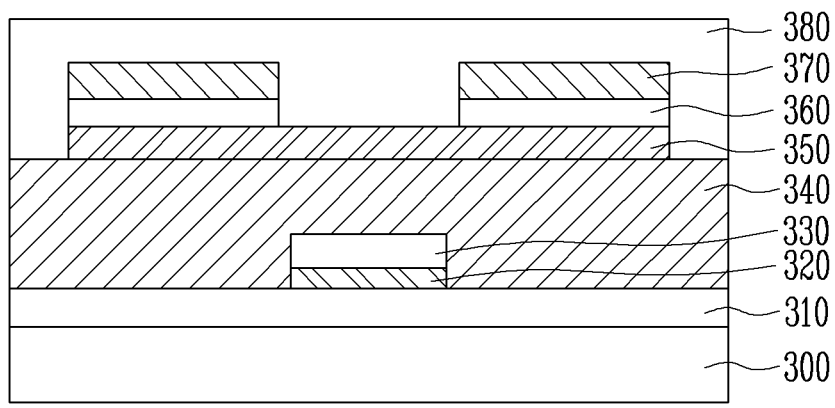

Finally, as shown in FIG. 3F, a protection layer 380 is formed to protect the channel.

In the inversed staggered-type transistor, one transparent layer in a stacked structure of a transparent layer/metal layer/transparent layer forming the source and drain electrodes and the gate electrode may be formed of a nitride layer having a high refractive index, thereby ensuring transparency and conductivity. And, one transparent layer may function as both an insulating layer and a channel semiconductor, thereby simplifying a process and reducing contact resistance.

Here, when the transparent layers respectively formed above and below the metal layers 320 and 360 are insulating layers, an oxide insulator such as $ZrO_2$ (refractive index=2.05), $HfO_2$ (refractive index=2.0), $Ta_2O_5$ (refractive index=2.1) or $TiO_2$ (refractive index=2.3), or a nitride insulator such as $Si_3N_4$ (refractive index=2.02) may be used.

A staggered-type transistor according to a third exemplary embodiment of the present invention will now be described with reference to FIGS. 4A to 4F.

Figure 4A:
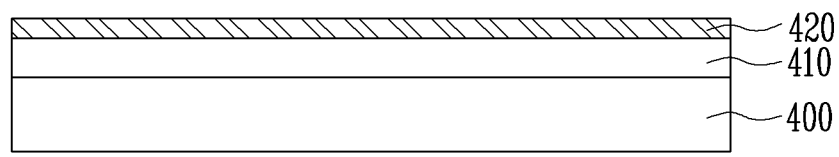
FIGS. 4A to 4F are cross-sectional views showing a process of manufacturing a transparent transistor according to a third exemplary embodiment of the present invention.
Figure 4B:
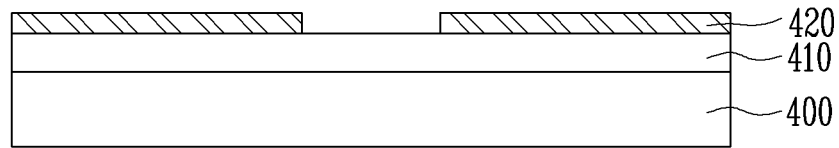
Figure 4C:
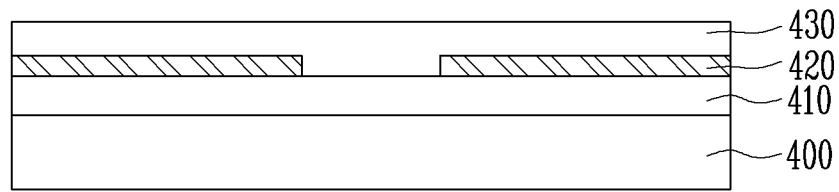
Figure 4D:
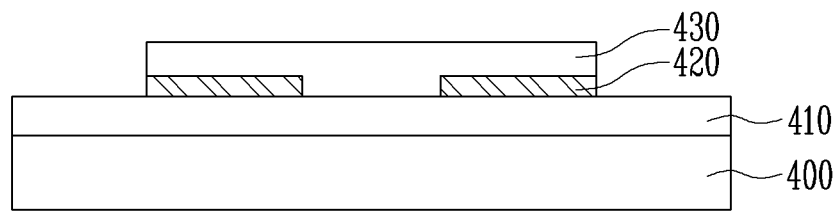

As shown in FIG. 4A, a transparent insulating layer 410 and a metal layer 420 are sequentially deposited on a substrate 400. Subsequently, a part of the metal layer 420 is etched to define a channel region as shown in FIG. 4B, and a transparent semiconductor layer 430 is deposited to fill the channel region as shown in FIG. 4C. As shown in FIG. 4D, the transparent semiconductor layer 430 and the metal layer 420 are etched to leave source and drain regions and the channel region, thereby forming source and drain electrodes and a channel.

The source and drain electrodes each have a multi-layered structure of the transparent insulating layer 410 at the bottom, the metal layer 420 and the transparent semiconductor layer 430.

Figure 4E:
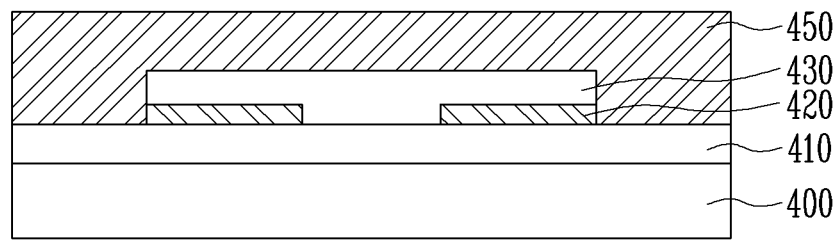
Figure 4F:
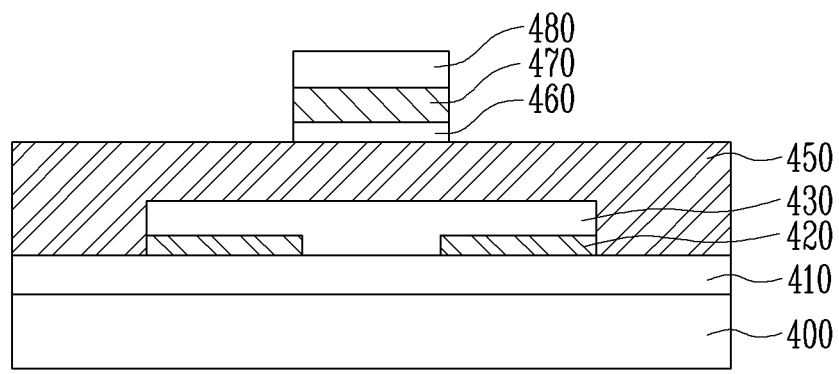

Subsequently, as shown in FIG. 4E, a gate insulating layer 450 is deposited on the entire surface of the substrate, and a multi-layered gate electrode is formed to be aligned with the channel using a mask used when the channel is formed on the gate insulating layer 450, thereby completing the staggered-type transistor as shown in FIG. 4F. Here, the gate electrode also has a multi-layered structure of a transparent layer 460, a metal layer 470 and a transparent layer 480, and one of the transparent layers 460 and 480 is formed of a nitride layer having a high refractive index.

Alternatively, an inverted coplanar-type transistor will be manufactured in a process shown in FIGS. 5A to 5H.

Referring to FIG. 5A, an insulating layer 510 having a high refractive index is deposited on the entire surface of a substrate 500, and a metal layer 520 and a transparent insulating/conductive layer 530 having a high refractive index are sequentially deposited. As shown in FIG. 5B, the metal layer 520 and the transparent insulating/conductive layer 530 are patterned to form a gate electrode.

After that, a gate insulating layer 540 is deposited on the entire surface of the substrate as shown in FIG. 5C, and a transparent insulating/conductive layer 550 and a metal layer 560 are sequentially deposited as shown in FIG. 5D.

Figure 5E:
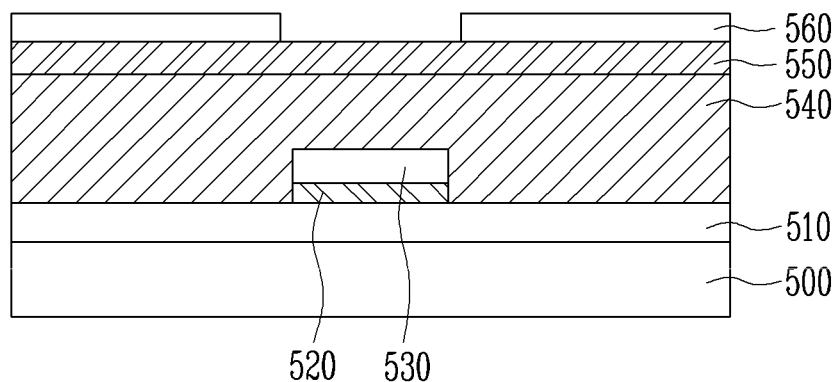
Figure 5F:
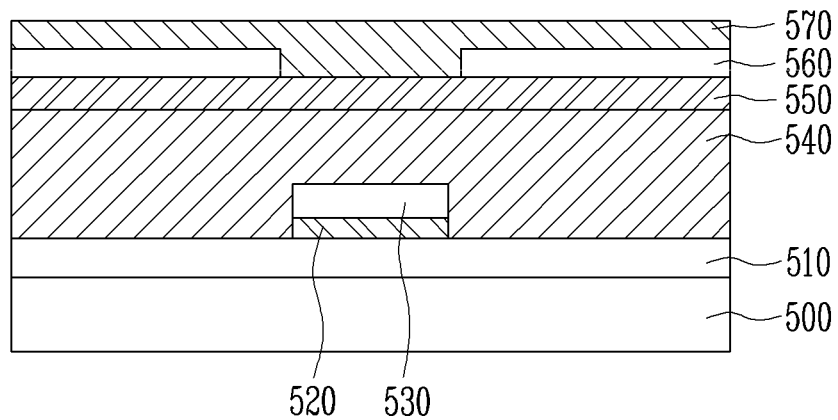

The metal layer 560 is etched using the same mask as that used for patterning the gate electrode to define a channel region as shown in FIG. 5E, and as shown in FIG. 5F, a transparent semiconductor layer 570 is stacked to fill the channel region.

Figure 5G:
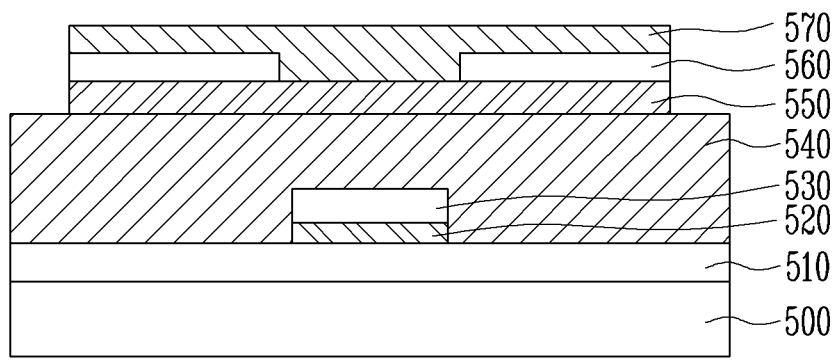
Figure 5H:
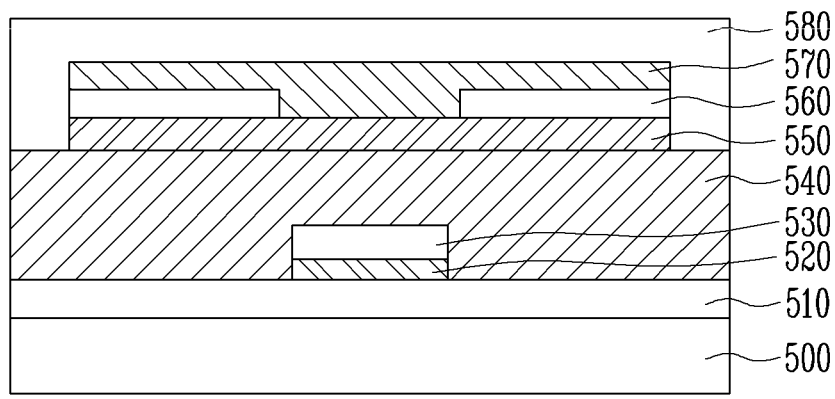

As shown in FIG. 5G, the semiconductor layer 570, the metal layer 560 and the transparent insulating/conductive layer 550 are etched to form source and drain electrodes and a channel, and a channel protection layer 580 is formed, thereby completing the transistor as shown in FIG. 5H.

A self-aligned transistor according to the present invention will now be described with reference to FIGS. 6A to 6F.

Figure 6A:
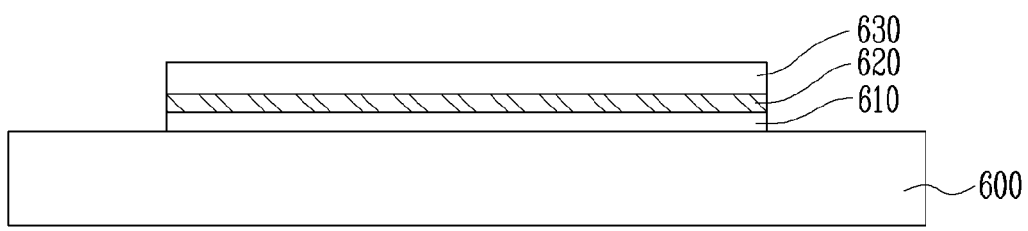
FIGS. 6A to 6F are cross-sectional views showing a process of manufacturing a transparent transistor according to a fifth exemplary embodiment of the present invention.
Figure 6B:
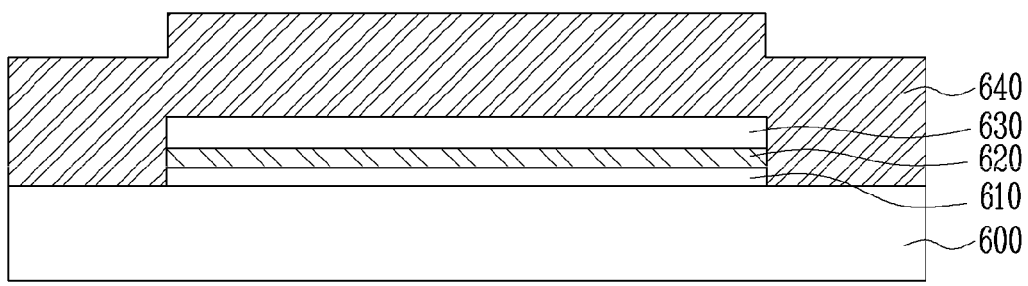
Figure 6C:
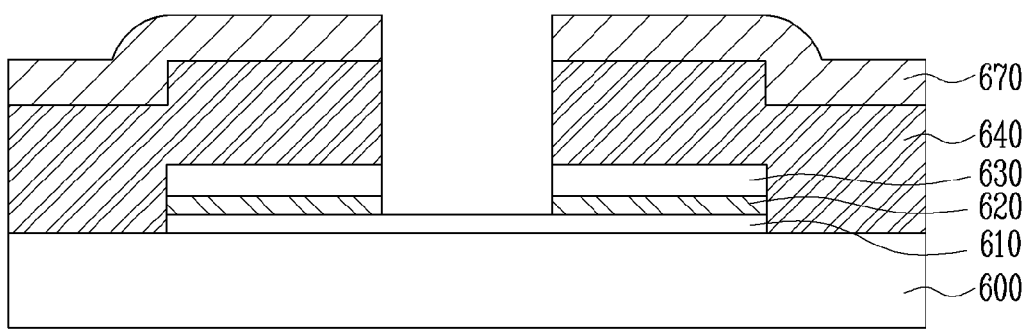
Figure 6D:
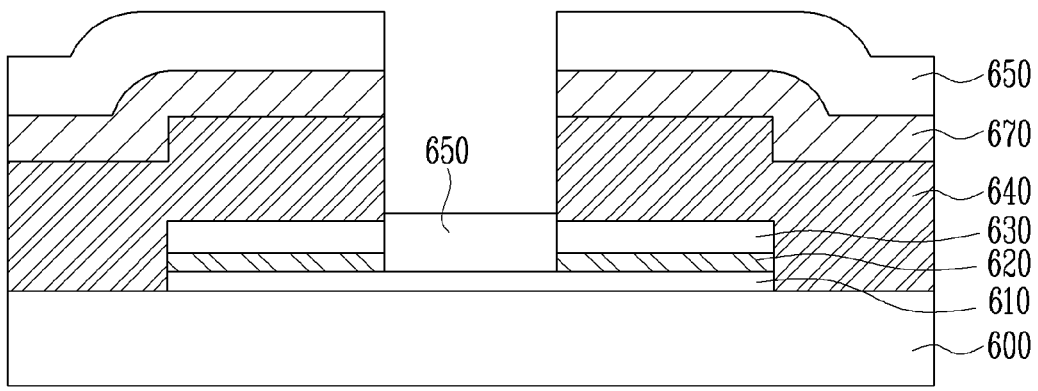
Figure 6E:
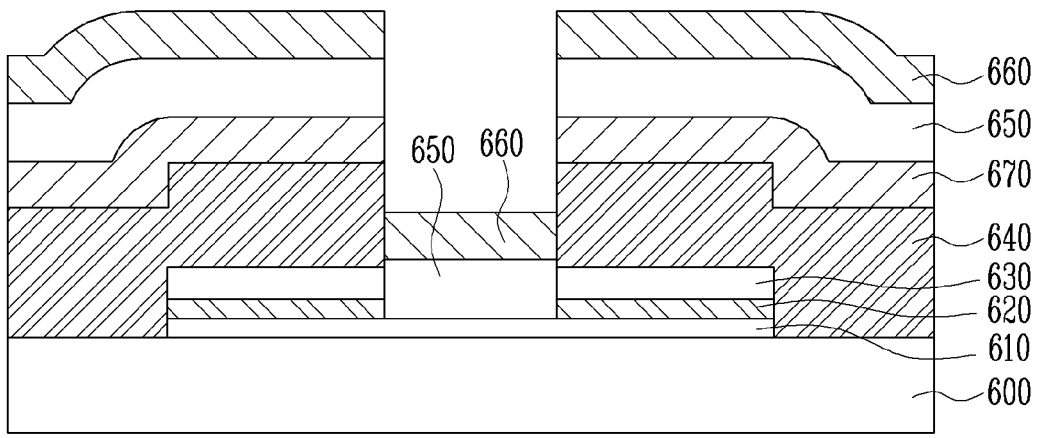
Figure 6F:
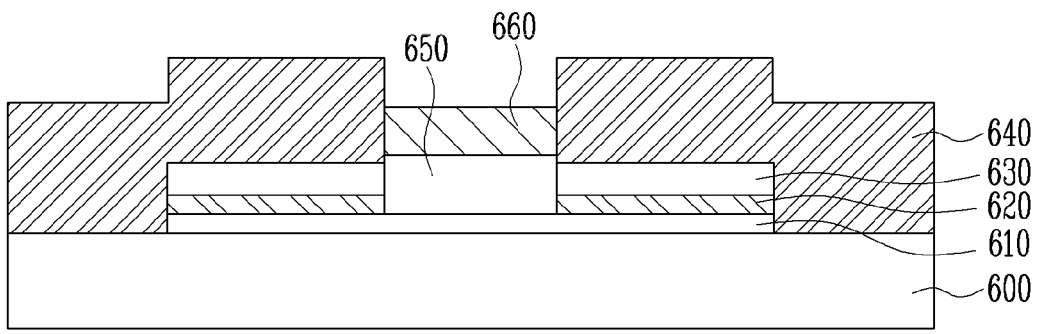

As shown in FIG. 6A, a transparent insulating/conductive layer 610, a metal layer 620 and a transparent semiconductor layer 630 are stacked on a substrate 600, and then patterned in shapes of source and drain electrodes and a channel. As shown in FIG. 6B, a first gate insulating layer 640 is formed, and as shown in FIG. 6C, a photoresist 670 is applied, followed by etching the first gate insulating layer 640, the transparent semiconductor layer 630 and the metal layer 620 in the channel region by photolithography. Subsequently, as shown in FIGS. 6D and 6E, a second gate insulating layer 650 and a gate electrode 660 are formed by blanket deposition, and the photoresist 670 is removed, thereby completing the self-aligned transistor shown in FIG. 6F.

The self-aligned transistor may be manufactured using a small number of masks, and overlap between the gate electrode and the source and drain electrodes is minimized, thereby minimizing a parasitic capacitance of the transistor. Since the second gate insulating layer 650 is operated as a substantial gate insulating layer, a driving voltage may be reduced by forming the gate insulating layer thin. And, when the first gate insulating layer 640 is formed to be sufficiently thick, a capacitance at a crossing point of interconnections may be decreased, thereby reducing signal delay.

According to the present invention, a multi-layered transparent conductive layer can ensure transparency and conductivity, and overcome a problem of contact resistance between source and drain electrodes and a semiconductor. Although deposition for forming the multi-layered transparent conductive layer is performed layer by layer, since patterning the multi-layered transparent conductive layer is performed all at once, processability can be improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a transistor, comprising:
   stacking a transparent semiconductor layer, a metal layer and a transparent layer on a substrate to form source and drain electrodes;
   forming a first gate insulating layer on the source and drain electrodes;
   applying a photoresist onto the first gate insulating layer, and etching the transparent layer and the metal layer using a mask to form a channel;
   forming a second gate insulating layer on the photoresist and the channel;
   forming a gate electrode on the second gate insulating layer; and
   removing the photoresist.

2. The method according to claim 1, wherein the transparent semiconductor layer or the transparent layer is formed of a nitride layer.

3. The method according to claim 1, wherein the first gate insulating layer is formed thicker than the second gate insulating layer.

* * * * *